United States Patent
Marks et al.

(10) Patent No.: US 7,679,079 B1
(45) Date of Patent: Mar. 16, 2010

(54) NANOSCALE SELF-ASSEMBLED ORGANIC DIELECTRICS FOR ELECTRONIC DEVICES

(75) Inventors: Tobin J. Marks, Evanston, IL (US);
Antonio Facchetti, Chicago, IL (US);
Myung-Han Yoon, Evanston, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 11/181,132

(22) Filed: Jul. 14, 2005

Related U.S. Application Data

(60) Provisional application No. 60/587,929, filed on Jul. 14, 2004.

(51) Int. Cl.
*H01L 35/24* (2006.01)
*H01L 51/00* (2006.01)

(52) U.S. Cl. .................. 257/40; 257/24; 257/E51.001; 438/82; 438/99

(58) Field of Classification Search .................. 257/40, 257/59, 72, E52.005, E51.001, 24; 438/82, 438/99
See application file for complete search history.

(56) References Cited

U.S. PATENT DOCUMENTS

| 5,156,918 A | 10/1992 | Marks et al. |
| 6,399,221 B1 | 6/2002 | Marks et al. |
| 7,329,897 B2* | 2/2008 | Nishikawa et al. ............ 257/40 |
| 2005/0001210 A1* | 1/2005 | Lee et al. ...................... 257/40 |

OTHER PUBLICATIONS

Yoon, MH; Facchetti, A; and Marks, TJ; σ-π Molecular Dielectric Multilayers For Low-Voltage Organic Thin-Film Transistors; PNAS, Mar. 29, 2005, 4678-4682, vol. 102, No. 13.
Facchetti, A; Yoon, MH; and Marks, TJ; Gate Dielectris For Organic Field-Effect Transistors: New Opportunities For Organic Electronics; Advanced Materials, 2005, 1-21, vol. 17.
Marks, TJ; Presentation entitled "Dielectric Layers for OFETs"; 6th International Symposium for Functional Pi-electron Systems, Cornell University, 2004.

* cited by examiner

*Primary Examiner*—Kenneth A Parker
*Assistant Examiner*—Joseph Nguyen
(74) *Attorney, Agent, or Firm*—Reinhart Boerner Van Deuren s.c.

(57) ABSTRACT

Organic thin film transistor and related composite and device structures comprising an organic dielectric medium comprising, for instance, a non-linear optical chromophoric moiety.

11 Claims, 5 Drawing Sheets

Figure 3A
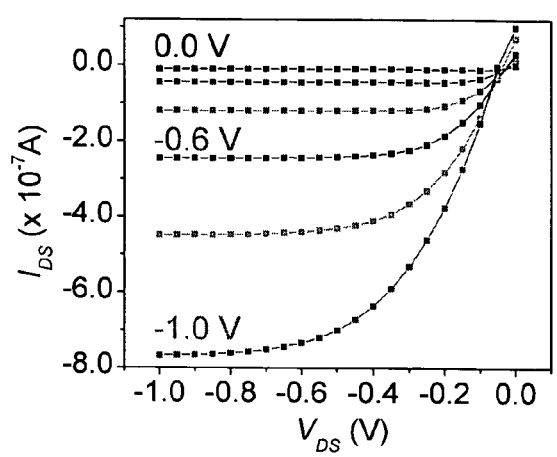
Figure 3B
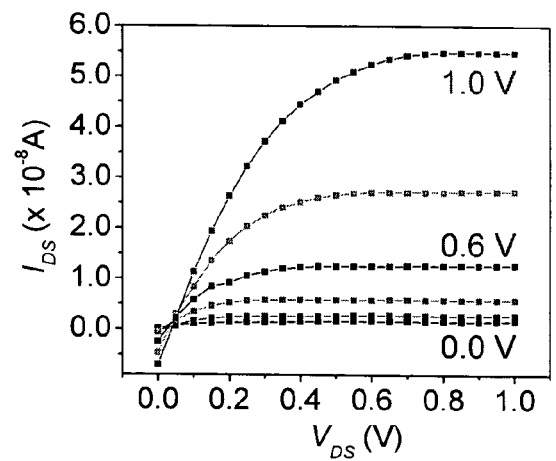
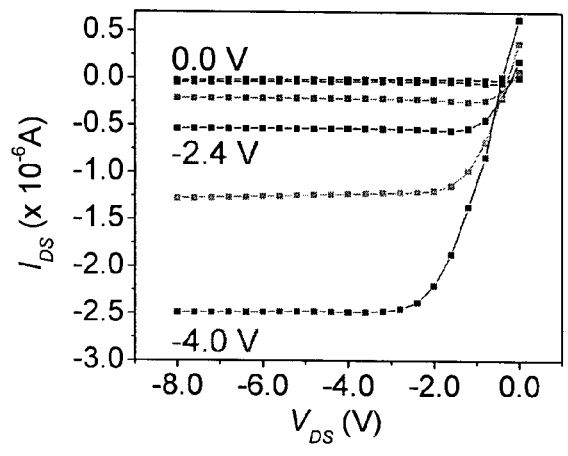
Figure 3C
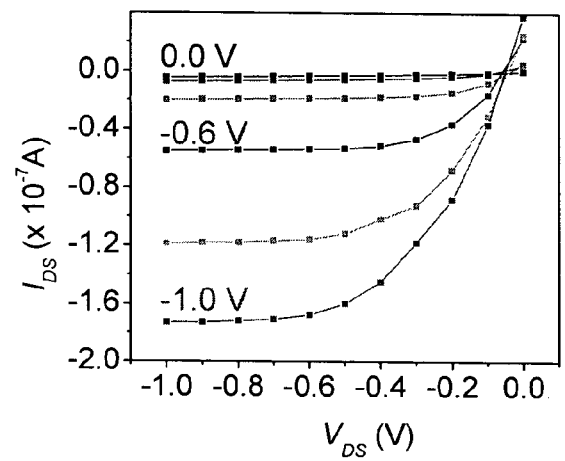
Figure 3D

Figure 4A
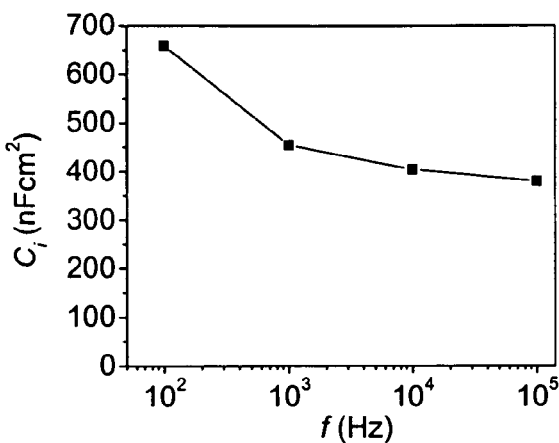
Figure 4B
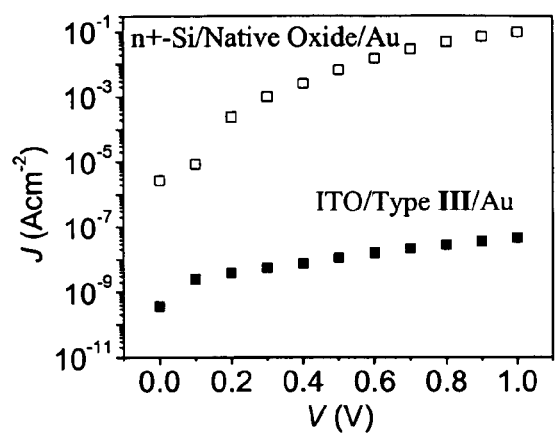
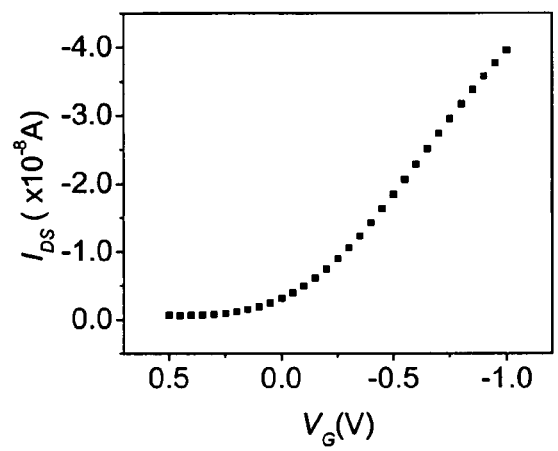
Figure 4C

NANOSCALE SELF-ASSEMBLED ORGANIC DIELECTRICS FOR ELECTRONIC DEVICES

This application claims priority benefit from provisional application Ser. No. 60/587,929, filed Jul. 14, 2004, the entirety of which is incorporated herein by reference.

The United States government has certain rights to this invention pursuant to National Science Foundation-MRSEC Grant No. DMR-0076097 and Office of Naval Research Grant No. N00014-02-1-0909, both to Northwestern University.

BACKGROUND OF THE INVENTION

During the past several years, organic thin-film transistors (OTFT) based on π-electron materials have been extensively investigated for applications where current inorganic semiconductors cannot be employed. One, but not the only, arena for this new technology will likely include low-cost electronic devices such as solution processed/printed circuits for "smart" cards, radio frequency ID tags, flexible large-area displays, and eventually flexible active-matrix LCD/LED screens. One criteria is the availability of organic semiconductors having, besides obvious stability under operation, requisite TFT performance (carrier mobility $\mu > 0.01$ cm$^2$/Vs; current on:off ratio $I_{on}:I_{off} > 10^5$) at sufficiently low operating source-drain/gate voltages ($V_{SD}/V_G$) and gate leakage currents to minimize power consumption. Many p-type and, to a lesser degree, n-type organic semiconductors exceed such metrics; however biases typically required to achieve such performance with conventional dielectric materials (silicon oxide, polymers, etc.) are unreasonably high for practical use (e.g., 50-100 V). Furthermore, relatively few studies have addressed the crucial issue of substantially reducing OTFT operating voltage, although the quest for thin "high-k" dielectrics is a major focus of current inorganic semiconductor research.

The source-drain current ($I_{SD}$) in the TFT linear operating regime is expressed by Eq. 1, where W and L are the TFT channel width and length, respectively, $V_T$ is the threshold voltage, and $C_i$ is the dielectric capacitance per unit area (Eq. 2 where k is the dielectric constant, $\epsilon_0$ is the permittivity of vacuum, and d is the dielectric layer thickness).

$$I_{SD} = \frac{W}{L}\mu C i \left[ V_G - V_T - \frac{V_{SD}}{2} \right] V_{SD} \quad (1)$$

$$Ci = \epsilon_0 \frac{k}{d} \quad (2)$$

For a given OTFT geometry and semiconductor material, similar current gains can be achieved at lower operating biases by increasing $C_i$. This is a useful relationship for OTFTs considering the relatively modest μ values (typically <1 cm$^2$V$^{-1}$s$^{-1}$ vs. 10$^3$ cm$^2$V$^{-3}$S$^{-1}$ for crystalline Si) exhibited by most organic semiconductors. Accordingly, recent approaches to increasing OTFT dielectric layer $C_i$ have been to employ vapor-deposited inorganic materials having k higher than commonly used SiO$_2$, such as Si$_3$N$_4$, BaSr$_x$Ti$_{1-x}$O$_3$, Ta$_2$O$_5$, and TiO$_2$ or to use solution phase self-assembled monolayers (SAMs) of simple monofunctionalized hydrocarbon chains as OTFT dielectric layers. That is, the strategies applied to date can be summarized as either increasing k or reducing d while minimizing leakage currents. While some success has been realized, each strategy has limitations.

SUMMARY OF THE INVENTION

In light of the foregoing, it is an object of the present invention to provide organic thin-film transistor devices and/or related methods for their use and operation, thereby overcoming various deficiencies and shortcomings of the prior art, including those outlined above. It would be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

It is an object of the present invention to provide a broad range of OTFT dielectric components comprising one or more of the non-linear optical (NLO) and/or high-β-chromophore compounds described or inferred elsewhere herein.

It can also be an object of the present invention to provide an OTFT dielectric component meeting or exceeding performance obtained with oxide and polymer dielectrics of the prior art, using without limitation pyridinium compounds of the sort described herein.

It can also be another object of the present invention to provide such performance at OTFT operational biases much lower than heretofore available through dielectric compositions and OTFT geometries of the prior art.

Other objectives, features, benefits and advantages of the present invention would be apparent from this summary and the following descriptions of certain embodiments, and will be readily apparent to those skilled in the art having knowledge of various OTFT devices and assembly/production techniques. Such objects, features, benefits and advantages will be apparent from the above as taken into conjunction with the accompanying examples, data, figures and all reasonable inferences to be drawn therefrom, alone or with consideration of the references incorporated herein.

In part, the present invention can be directed to an organic thin film transistor device comprising an organic dielectric medium and an organic semiconductor component thereon. Such a medium can comprise at least one organic dipolar layer comprising a compound comprising a π-polarizable moiety cross-linked with a siloxane bond sequence. In certain embodiments, such a dielectric medium can comprise a hydrocarbon layer coupled with silicon-oxygen bonds to such a dipolar layer. In certain other embodiments, such a dielectric medium can further comprise at least one siloxane capping layer coupled to such a dipolar layer, with silicon-oxygen bonds. Regarding such embodiments, a siloxane capping layer can be positioned between a dipolar layer and a hydrocarbon layer, coupled to each with silicon-oxygen bonds.

Such a silicon-oxygen bonding sequence can be the condensation product of a hydrolyzable silicon moiety (e.g., without limitation, a halogenated silyl moiety) and a hydroxyl functionality. As understood in the art and explained more fully in one or more of the references incorporated herein, such a bonding sequence can derive from use of starting material compounds for the respective dielectric layers, such compounds substituted with one or more hydrolyzable silicon moieties, hydrolysis of such a moiety under self-assembly conditions, and condensation with a subsequent layer starting material or precursor compound.

Regardless, in certain embodiments, a dipolar layer of such a dielectric medium can comprise a compound comprising conjugated π-electrons and at least one of a dipole moment, an electron releasing moiety, an electron withdrawing moiety, a combination of such moieties, a zwitterion and a net charge. Without limitation, such a dipolar layer can comprise a non-linear optical chromophore of the sort described more fully below. Likewise, representative of such compounds, such a chromophore can comprise a stilbazolium moiety. The identity of such compounds are limited only by their electronic/structural features and resulting polarizability in the context of OTFT employment and use, as illustrated by various representative embodiments described herein. Regardless, such a dipolar layer can be utilized in conjunction with a hydrocarbon layer comprising a compound comprising an alkyl moiety ranging from about $C_4$ to about $C_{10}$. Optionally, a dielectric medium of this invention can further comprise a siloxane capping layer between a dipolar layer and a hydrocarbon layer. Such a capping layer can comprise one or more siloxane molecular components, each coupled one to another with silicon-oxygen bonds.

This invention can also be directed to a thin film composite of the sort useful in an OTFT device, such a composite comprising an organic semiconductor and an organic dielectric medium. Such a medium can comprise various combinations of hydrocarbon, siloxane capping and π-polarizable layers, each layer coupled one to another with silicon-oxygen bonds. Useful hydrocarbon and siloxane layers include those discussed above and elsewhere herein, in particular and without limitation, such hydrocarbon compounds comprising $C_8$ alkyl and trisiloxane moieties, respectively. Likewise, a π-polarizable layer can comprise a non-linear optical chromophore, in particular and without limitation, such a compound comprising a stibazolium moiety.

Precursor compounds incorporated into such layers include bis-trichlorosilyloctane, octachlorotrisiloxane and 4-[[(4-[(N,N-bis((hydroxy)ethyl)amino]-phenyl]azo]-1-(4-trichlorosilyl)benzyl-pyridinium iodide, such compounds condensed one with another, with corresponding layers assembled to provide dielectric media in accordance with this invention.

Further, this invention can be directed to one or more methods of using a π-polarizable dipolar component to enhance dielectric effect in the context of an organic thin film transistor device. Such a method can comprise designing the dielectric medium of an OTFT device, such a medium comprising at least one of a hydrocarbon layer(s) and a siloxane capping layer(s), such layers as described more fully above and coupled one to another with silicon-oxygen bonds; and incorporating into such a medium a dipolar layer comprising a compound comprising a π-polarizable moiety, such a dipolar layer coupled to at least one of a hydrocarbon layer and a siloxane capping layer with silicon-oxygen bonds. Such a dielectric medium can be assembled on a range of available substrate materials, each of which as can be provided in conjunction with a coating of indium tin oxide. Regardless of substrate material or dielectric composition, a semiconductor of such a device, deposited on the dielectric medium, can be selected from available n-type and p-type semiconductor compounds known in the art.

While several of the aforementioned layers and component compounds or moieties are illustrated herein, various other component compounds and associated moieties are contemplated within the scope of this invention, as would be understood by those skilled in the art made aware thereof. For instance, without limitation, various other π-polarizable component compounds and associated moieties are described in U.S. Pat. No. 6,855,274, in particular the NLO structures of FIGS. 1-2, 11, 13 and 15 thereof, U.S. Pat. No. 6,549,685, in particular FIGS. 2-3 thereof, and U.S. Pat. No. 5,156,918, in particular the structures of FIGS. 4-5 thereof, each with reference to the corresponding specification regarding alternate embodiments synthesis and characterization, each of which is incorporated herein by reference in its entirety. Further, as would be understood by those skilled in the art, various other non-linear optical chromophore compounds are described in "Supramolecular Approaches to Second-Order Nonlinear Optical Materials. Self-Assembly and Microstructural Characterization of Intrinsically Acentric [(Aminophenyl)azo]pyridinium Superlattices", Journal of American Chemical Society, 1996, 118, 8034-8042, which is hereby incorporated by reference in its entirety. Such layer component compounds can be used, as described herein, with a variety of difunctionalized hydrocarbon layer and/or siloxane capping layer component compounds, such compounds without limitation as to hydrocarbon length or degree of functionalization capable of condensation with a suitable substrate and/or various other dielectric layers or components in accordance with this invention.

The dielectric π-polarizable layer and/or components of this invention can comprise various π-conjugated pyridinium moieties. For purposes of the present dielectric media, compounds and/or moieties, "π-conjugated pyridinium" will be understood by those skilled in the art made aware of this invention to mean a molecular entity comprising a pyridinium structure substituted at the 4-position with a conjugated π-electron system, such entities including but not limited to those representative entities, structures and/or systems provided, described, characterized and/or inferred in the aforementioned and incorporated '274, '918 and '685 patents.

Likewise, without limitation, the dielectric media of this invention can be used in conjunction with a variety of semiconductors known in the art, including but not limited to representative compounds of the type disclosed herein. For purpose of illustration, such p-type semiconductors include various alkyl and aryl-substituted thiophene compounds. Non-limiting n-type semiconductors can comprise various perylene compounds of the type described in co-pending application Ser. No. 11/043,814 filed Jan. 26, 2005, and electron withdrawing-substituted thiophene compounds of the type described in U.S. Pat. No. 6,608,323 and co-pending application Ser. No. 60/609,678, together with applications claiming priority therefrom.

BRIEF DESCRIPTION OF THE DRAWINGS

FIG. 3. Thin film transistor output characteristics as a function of gate voltage ($V_G$) for nanodielectric-based devices fabricated with: (A) n$^+$-Si/type II/DH-6T (4; p-type). (B) n$^+$-Si/type III/F$_{16}$PcCu (7; n-type). (C) n$^+$-Si/type III/DH-6T. (D) ITO/type III/DH-6T. Semiconductor structures are identified in FIG. 6.

FIG. 4. (A) C-V characteristics of type III dielectric on ITO at different frequencies. (B). Current density versus voltage plots for n$^+$-Si-native oxide and ITO-type III-Au structures. (C) Transfer plot for DH-6T on ITO-type III-based OTET device.

DETAILED DESCRIPTION OF CERTAIN EMBODIMENTS

As illustrated by certain non-limiting embodiments, this invention provides a layer-by-layer self-assembly process, robust, conformal, insoluble, virtually pinhole-free nanoscopic high-$C_i$ organic dielectric compounds and/or compositions. These in turn can afford very low-bias, low-leakage current OTFTs comprising various combinations of one or more of the following representative component layers (e.g., FIG. 6): A self-assembled difunctionalized hydrocarbon, $C_n$ (e.g. n=8), chain (1), such as but not limited to or comprising (Cl$_3$Si(CH$_2$)$_8$SiCl$_3$); such self-assembling difunctional hydrocarbon monolayers undergo transverse crosslinking, enabling precision stepwise layer build-up, increasing interchain packing, and reducing defects/pinholes; a highly polarizable layer (2), such as but not limited to or comprising stilbazolium. As understood in the art, self-assembled, oriented dipolar layers should stabilize charge carriers in the proximate semiconducting organic channel, including bound charges and free charges generated when a $V_G$ is applied; and one or more, n, capping layers (3), such as but not limited to or comprising octachlorotrisiloxane (e.g., n=3). Multilayer structural robustness can be additionally enhanced by capping/planarizing with a highly crosslinked, glassy polysiloxane.

Figure 6:
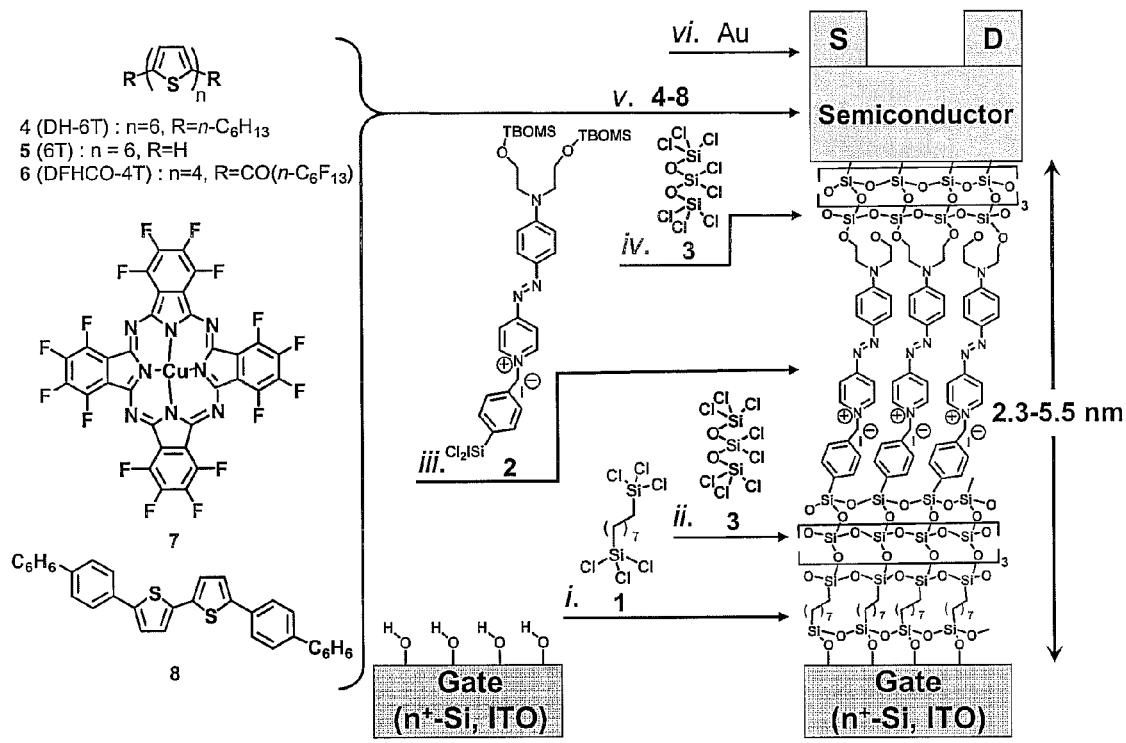
FIG. 6. Nanodielectric structure and OTFT fabrication scheme. i) Self-assembly (SA) of bifunctional hydrocarbon 1; ii) SA of capping reagent 3; iii) SA of stilbazolium salt 2; iv) SA of capping reagent 3; v) Vapor/solution-deposition of semiconductor 4, 5, 8 (p-type) or 6, 7 (n-type); vi) Source-drain Au electrode deposition.

Without limitation, nanodielectric structures of types I (layers 1+3), II (layers 2+3), and III (layers 1+3+2+3), and subsequent OTFT devices can be fabricated according to FIG. 6. Unless otherwise specified, highly n-type doped (0.007-0.02 Ωcm) Si(100) wafers with a native oxide coating (~1.5 nm thick by ellipsometry) were used as substrate/gate electrodes. After layer-by-layer deposition of the dielectric, the OTFT structure was completed by vacuum-deposition (~10$^{-6}$ Torr) of p- and n-type semiconductors 4-7 (50 nm at 0.2 Å/s) or solution-deposition of semiconductor 8 (200 ppm in xylene), followed by source-drain Au contact vacuum deposition (50 nm at 0.3 Å/s). The structure/function of nanodielectrics I-III were characterized by ellipsometry, synchrotron X-ray reflectivity (XRR), second harmonic generation (SHG) spectroscopy, AFM, SEM, electrochemistry, and metal-insulator-semiconductor (MIS) leakage current and capacitance measurements. As mentioned above, it will be understood by those skilled in the art that while semiconductors 4-8 are used to illustrate several features and benefits of this invention, various other semiconducting components known in the art can be used with comparable results in device fabrication, thereby demonstrating a broader utility of this invention.

Figure 1B:
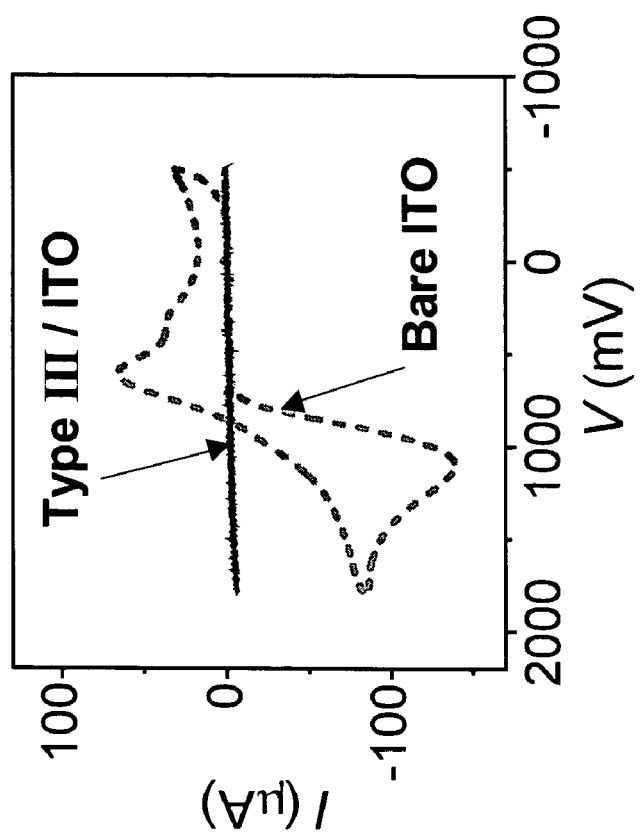
FIG. 1. (A) Cyclic voltammograms for ferrocene/ferrocenium$^+$ in THF/tetrabutylammonium perchlorate using bare ITO (dotted line) and dielectric-III coated ITO as working electrodes. ITO=tin-doped indium oxide, a transparent oxide conductor. (B) Current density versus voltage plots without (bare substrate) and with nanodielectrics I-III in metal-insulator-semiconductor (MIS) structures on n$^+$-Si.
Figure 1A:
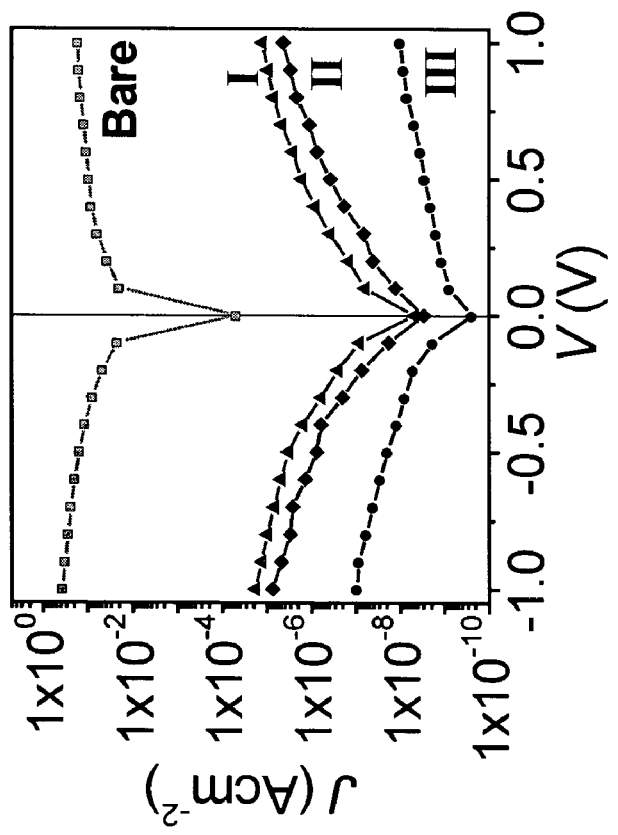

X-ray reflectivity-derived thicknesses of the nanoscopic dielectrics [d=2.3 (I), 3.2 (II), 5.5 (III) nm (±10%)] are in excellent agreement with those from molecular modeling and the metrical parameters of 1-based multilayers and 2, 3-based superlattices. SHG measurements on II/III demonstrate net polar alignment of the stilbazolium dipoles with an average tilt angle of ~40° from the surface normal, while AFM and SEM images of I-III are featureless, consistent with smooth (RMS roughness ~0.5-1.0 nm), crack/pinhole free morphologies. Indication of the excellent insulating properties of I-III is provided by cyclic voltammetry (CV) experiments (FIG. 1A) performed for 1.0 mM ferrocene solution (0.1 M TBAP in THF) oxidation/reduction using bare ITO-coated glass (ITO=tin-doped indium oxide) and that having self-assembled structures I-III (~0.5 cm$^2$ area) as working electrodes. Judging from the magnitude of current flowing at any potential, there is successive passivation of the ITO surface with respect to ferrocene redox chemistry as successive dielectric layers are built up, arguing that the self-assembled dielectric layers are sufficient to eliminate the majority of pinholes (potential short circuits) which would compromise OTFT performance. Quantitative leakage current measurements through the nanodielectrics were made in metal-insulator-semiconductor (MIS) structures fabricated by thermal evaporation of Au dot contacts (200×200 μm$^2$) through a shadow mask onto I-III (FIG. 1B). While the Si substrates coated only with native oxide exhibit current densities of ~0.1-1.0 A/cm$^2$ at 1.0 V, type I/II and III structures reduce the leakage currents by ~6 and ~9 orders of magnitude, respectively. The current densities for III (~10$^{-9}$ A/cm$^2$) are comparable to the lowest reported SAM values obtained with 100×100 μm$^2$ Al contacts. Note that the actual current level in such a device approaches the instrumental limit (10$^{-14}$ A), considering the small Au electrode dimensions. Furthermore, the measured breakdown fields for I-III (5-10 MVcm$^{-1}$) rival or exceed those reported for far thicker (~50 nm) oxide and polymer dielectrics (0.1-5 MVcm$^{-1}$) previously employed in OTFTs.

Figures 2A, 2B:
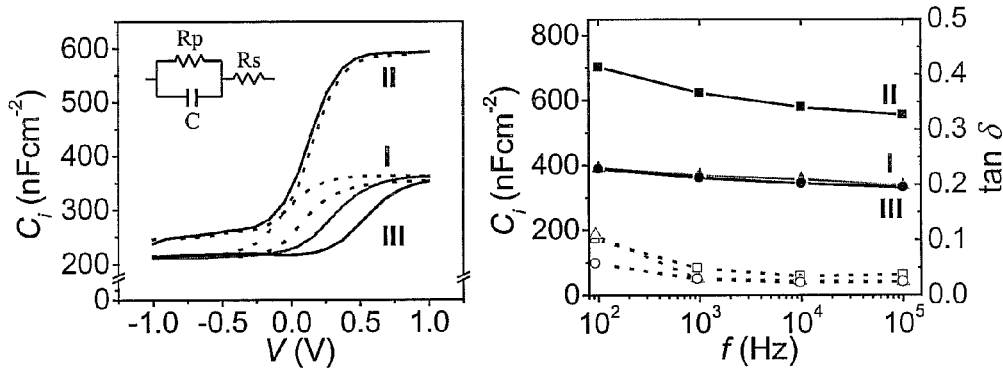
FIG. 2. (A) Capacitance-voltage characteristics of type I, II, and III nanodielectrics at $10^4$ Hz (solid line is the forward scan, broken line is the return scan). (Inset) equivalent circuit representation $[Z_t=R_s+1/[1/R_p+i2\pi fC]$ where $R_s$=series resistance, $R_p$=parallel resistance, C=capacitance]. Note that the contribution of the nanodielectric capacitor component $2\pi fC$ ($10^4$-$10^7\Omega$) to the total circuit impedance ($Z_t$) predominates over the series $R_s$(<100) and the parallel Rp (>1010) resistances as well as over the parasitic capacitance (<2 pF) estimated in the present frequency range. (B) Frequency (f) dependence of the maximum capacitance and dielectric loss in the accumulation regime (1 V) between 102-105 Hz for indicated nanodielectrics.

To assess the electrical quality of the new dielectric materials, C-V (capacitance-voltage) measurements were carried out on MIS structures in the 10$^2$-10$^5$ Hz range. FIG. 2A shows representative 10$^4$ Hz data. Since n$^+$-Si is the semiconductor, capacitance is expected (and found) to increase on sweeping the bias with respect to the metal contact from negative (depletion in the semiconductor) to positive (accumulation). Capacitance- and dielectric loss (tan δ)-frequency plots (FIG. 2B) reveal maximum capacitance $C_i$=400 (I); 710 (II); 385 (III) nFcm$^{-2}$ (±5%) at 10$^2$ Hz, with slight fall-off (~15%) with increasing frequency. These values are much greater than that of conventional 300 nm-thick SiO$_2$ (~5-10 nFcm$^{-2}$) and comparable to the highest $C_i$=150-750 nFcm$^{-2}$ (d=50-100 nm) for vapor-deposited TiO$_2$- and TiO$_2$/SiO$_2$-based dielectrics. The loss factor (~10$^{-1}$-10$^{-2}$) is somewhat greater than in typical optimized CMOS SiO$_2$ (~10$^{-4}$), but comparable to that of high-k materials such as BaTiO$_3$ and polymeric insulators such as PVC and nylon. At all frequencies, I and III exhibit relatively large hystereses (0.3-0.4 V) whereas that of II is considerably smaller (<0.1 V). Annealing at 120-180° C. reduces hysteresis (<0.1V for all samples) and C-V curve dispersion with frequency. This suggests that the pristine nanodielectrics contain significant quantities of fixed positive charges ($Q_f$), ~2–5×10$^{12}$ cm$^{-2}$. When the C-V transition from inversion to accumulation is sharp with small changes in the depletion C-V slope with frequency (no stretch-out), the interface trap contribution can be generally ignored (they cannot follow the ac voltage at high frequency) and fixed charge density can be estimated from $Q_f = C\Delta V_{FB}$, where $\Delta V_{FB} \approx [V_{FB}(10^5 \text{ Hz})-V_{FB}(10^2 \text{ HZ})]]$. See, E. K. Evangelou, C. Wiemer, M. Fanciulli, M. Sethu, W. Cranton, *J. Appl. Phys.* 94 318 (2003). The interface state densities ($D_{it}$) calculated from the C-V and G-V (conductance-voltage) plots are $\sim 3 \times 10^{12}$ cm$^{-2}$ eV$^{-1}$. See, W. A. Hill, C. C. Coleman, *Solid-State Electron.* 23 987 (1980):

$$Dit = \frac{2}{eA}\left(\frac{G_{max}}{\omega}\right)\left[\left(\frac{G_{max}}{\omega Ci}\right)^2 + \left(1 - \frac{C_{Gmax}}{Ci}\right)^2\right],$$

where A is the area of the capacitor, e is the electron charge, $C_i$ is the capacitance in accumulation, $G_{max}$ is the peak conductance value, and $C_{Gmax}$ is the capacitance corresponding to $G_{max}$. Annealing reduces both $Q_f$ and $D_{it}$ to $\sim 10^{11}$ cm$^{-2}$ eV$^{-1}$, near reported values for SiO$_2$ and many high-k dielectrics ($\sim 10^{10}$-$10^{11}$ cm$^{-2}$ eV$^{-1}$).

Effective dielectric constants ($k_{eff}$) of the nanoinsulator mutilayers (I-III+native oxide) can be calculated from $k_{eff} = (C_i \cdot d_{tot}) \epsilon_0$ (Eq. 2), where $d_{tot}$ is the metal-semiconductor distance ($d_{I-III}+d_{NO}$) and are found to be 1.8, 3.9, and 3.1 for I, II, and III, respectively. The dielectric constants of the individual alkyl (2) and stilbazolium (3) layers ($k_{org}$) of I-III were next estimated assuming two parallel-plate capacitors in series (Eq. 3).

$$\frac{d_{tot}}{k_{eff}} = \frac{d_{org}}{k_{org}} + \frac{d_{ox}}{k_{ox}} \qquad (3)$$

Since capping layer 1 forms a well-defined SiO$_x$ network ($d_{cap}$=0.83±0.1 nm) (23), $k_{eff}$ of I and II can be approximated by double-layer structures composed of 2 and 3, respectively, and a 2.6 nm-thick ($d_{ox}$=$d_{cap}$+$d_{NO}$) oxide layer ($k_{ox}$~3.9). See, S. M. Sze, *Semiconductor Devices: Physics and Technology* (Wiley, New York, ed 2, 1985), pp. 6-7, 216-218, 507-510. Therefore, $k_{org}$ of the 1 and 2 layers is estimated to be ~0.9 and 4.0, respectively. Irrespective of the absolute $k_{org}$ values, this result illustrates the strategic importance of the highly π-polarizable "push-pull" layer in increasing $k_{eff}$ and therefore $C_i$.

From the published data, k values are estimated at <1 (non-physical) for a number of simple alkyl SAM dielectrics (P. Fontaine et al., *Appl. Phys. Lett.* 62 2256 (1993)). Note that the derived $k_{org}$ of I is considerably lower than that of bulk paraffin/polyethylene dielectrics (2.0-2.5), which appears to reflect several factors: 1) In this nanoscale regime, the physical thickness of the insulator ($d_{tot}$) may be smaller than the effective dielectric thickness due to quantum effects which limit maximum charge stored in the accumulation layer (R. P. Olivo, T. N. Nguyen, T. Kuan, G. Ferriani, *IEEE Trans. Electron. Devices* ED-35, 432 (1988)). Note that this effect results in actual underestimation of $C_i$. 2) The SAM density may be lower than that of the bulk organic materials. It is estimated from X-ray reflectivity data that the effective alkyl (e.g., $C_8H_{16}$, a representative alkyl moiety of a hydrocarbon layer compound of this invention) density is ~0.5 gcm$^{-3}$ (1-based SAMs have a density of 2.5±0.5×10$^{14}$ molecule cm$^{-2}$ and the length of the —(CH$_2$)$_8$— chain is ~1 nm.), which is 30-50% smaller than for paraffins/polyethylene (0.7-1.0 gcm$^{-3}$). 3) Previous XRR studies indicate that the electron density of 3-derived siloxane layers is ~85% that of native oxide (23), suggesting a $k_{ox}$ value <3.9. Therefore, the actual $k_{org}$ of 1 (and by the same reasoning, of 2) exceeds the estimated values.

All TFTs (L=100 μm, W=5 mm) based on the present nanodielectrics exhibit reproducible TFT I-V characteristics at very low biases, as exemplified by response data for typical p- (DH-6T, 4) and n-type (F$_{16}$PcCu, 7) semiconductors (FIG. 3). Note that the bias operation window can be enlarged from $V_G$=1 V ($V_{DS}$=1 V) to $V_G$=4 V ($V_{DS}$=8 V) on substituting nanodielectric multilayer III for II (FIG. C), due to the increased breakdown resistance, in excellent agreement with the above leakage current results. Similar modulation characteristics are obtained for a range of vapor- and solution-deposited organic semiconductors, demonstrating broad generality. In marked contrast to these results, control devices fabricated with a thermally grown SiO$_2$ dielectric (300 nm) exhibit no useful source-drain current modulation over these same voltage range.

Figure 5A:
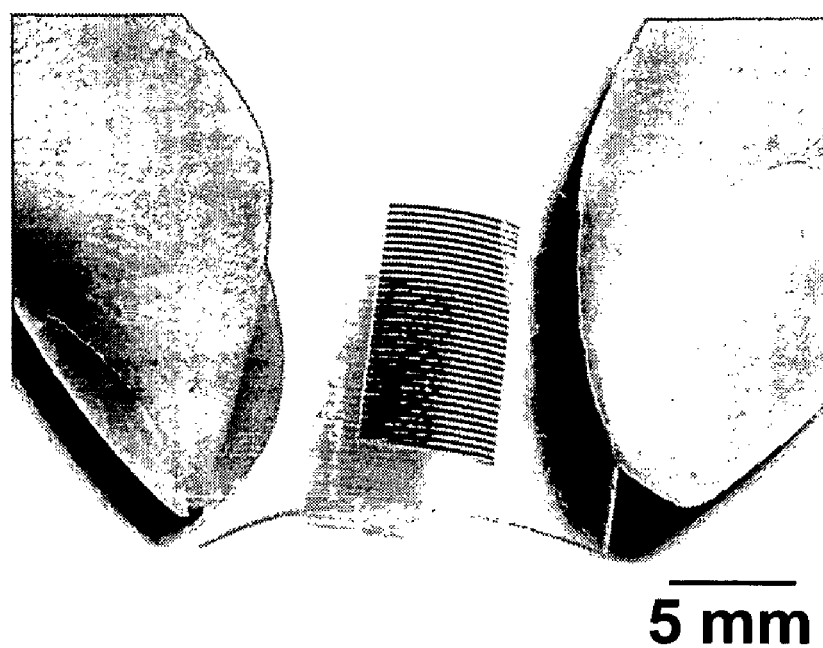
FIG. 5. (A) Picture of flexible ITO-based TFT. (B) TFT output characteristics as a function of $V_G$ for nanodielectric-based type III grown on mylar-ITO substrates.
Figure 5B:
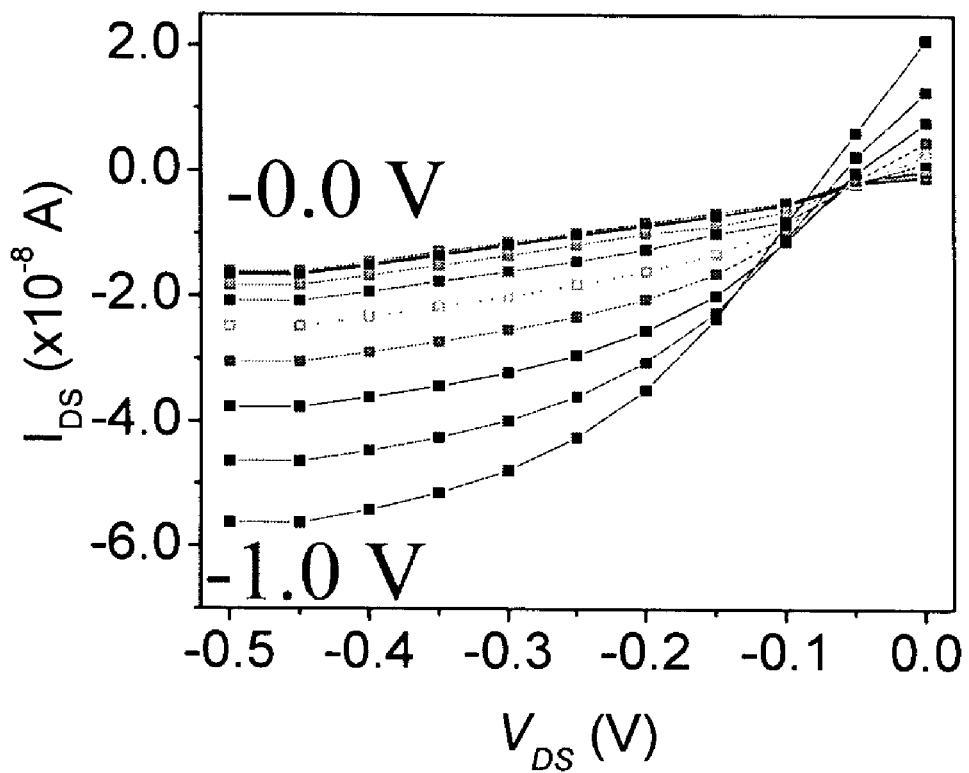

The type III nanodielectric was evaluated extensively in TFT geometries. Table 1 summarizes responses data for semiconductors 4-9 (operating biases 0.0-±1.0 V) and for comparison, those using standard 300 nm SiO$_2$ as the gate dielectric (operating biases 0-100 V). Comparable field effect mobilities are obtained at far smaller operating biases and threshold voltages are now only fractions of volts. The current $I_{on}$:$I_{off}$ ratios should be further enhanced with modified device designs and by patterning the semiconducting layer for further device isolation. Note here that TFT, fabricated on glass-coated ITO (FIGS. 3D and 4) substrates function comparably, demonstrating that the combination of any one of I-III with the Si native oxide is not required to achieve good dielectric performance. Finally, initial studies demonstrate that these nanodielectrics yield working TFTs on commercially-available, flexible mylar-coated ITO gates (FIG. 5), demonstrating applicability in flexible plastic electronics.

TABLE 1

FET Data for Organic Semiconductors 4-8 using the Type III Nanodielectric on n+-Si substrates.[a]

| Semiconductor | μ (cm$^2$V$^{-1}$s$^{-1}$) | $I_{on}$:$I_{off}$[b] | $V_T$(V) |
|---|---|---|---|
| 4 | 0.06 (0.08) | 8 × 10$^2$ (10$^4$) | 0.08 (−4) |
|   | 0.03[c] | 6 × 10$^2$ | 0.05 |
|   | 0.02[d] | 2 × 10$^{2c}$ | 0.06[c] |
|   | 0.04[e] | 1 × 10$^{3d}$ | 0.03[d] |
| 5 | 0.002 (0.02) | 5 × 10$^2$ (10$^4$) | −0.17 (2) |
| 6 | 0.02 (0.2) | 6 × 10$^2$ (10$^5$) | 0.21 (14) |
| 7 | 0.003 (0.001) | 3 × 10$^2$ (10$^4$) | −0.22 (20) |
| 8 | 0.01 (0.02) | 2 × 10$^2$ (10$^4$) | −0.20 (−40) |

[a]Data in parentheses are for 300 nm SiO$_2$ dielectric based devices. All FET mobilities ($\mu_{FET}$) calculated in the saturation regime from $\mu_{FET}$ = (2$I_{DS}$L)/ [WC$_i$(V$_G$ − V$_T$)$^2$], where $I_{DS}$ is the source-drain saturation current, L is the channel length, W the channel width, V$_G$ the gate voltage, and V$_T$ the threshold voltage. The latter can be estimated as the x intercept of the linear portion of V$_G$ vs. ($I_{DS}$)$^{1/2}$ plots (at V$_{DS}$ = 1 V).
[b]Calculated at V$_G$ = 0-1 V (0-100 V).
[c]Data for type III on glass-ITO substrates.
[d]Data for type II dielectric.
[e]Data for type I dielectric.

As demonstrated, judicious design and implemantation of self-assembling siloxane building blocks allows solution phase, layer-by-layer fabrication of extremely thin nanostructurally ordered, pinhole-free, high-capacitance/low leakage organic dielectrics. Electrical data (MIS, TFT) demonstrate that these nanodimensioned (e.g., from about 2.3 to about 5.5 nm thick) organic dielectric, insulating media can be efficiently integrated into large TFT structures (single TFT area ~10$^{12}$ nm$^2$) using a variety of substrates. These devices function for both p- and n-channel semiconductors, the molecular components of which exhibit greatly differing core structures and substituent functionalities. Substantial TFT response is achieved at very low operational biases, without serious leakage currents. Analysis of MIS/OTFTs based on type I/II and III dielectrics points the way to further enhancements in device metrics and underscores that chemically-tailored nanodielectrics represent a new approach to high-performance, low-power dissipation organic TFTs.

EXAMPLES OF THE INVENTION

The following non-limiting examples and data illustrate various aspects and features relating to the composites, compositions, devices and/or methods of the present invention, including the assembly, configuration and/or use of an OTFT dielectric thin layer comprising various molecular components or moieties, as are available through the synthetic methodology described herein. In comparison with the prior art, the present dielectric media, composites, compositions, devices and/or methods provide results and the data which are surprising, unexpected and contrary thereto. While the utility of this invention is illustrated through the use of several composites, compositions and related device structures and molecular components or layers which can be used therewith, it will be understood by those skilled in the art that comparable results are obtainable with various other composites, compositions and components/layers, as are commensurate with the scope of this invention.

Example 1

The bis-trichlorosilane-functionalized alkyl chain ($Cl_3Si(CH_2)_8SiCl_3$) and octachlorotrisiloxane reagents were purchased from Gelest, and the stilbazonium salt precursor was prepared according to the aforementioned, incorporated patents and a literature procedure. See, also Zhu, P.; vad der Boom, M. E.; Kang, H.; Evmenenko, G.; Dutta, P.; Marks, T. J. Chem. Mater. 2002, 14, 4982 which is incorporated herein by reference in its entirety. Native oxide coated highly n-doped silicon (100) wafers were purchased from Montco Silicon Tech, Spring City, Pa. ITO-coated glass substrates (20Ω/sq; 20-30-Å rms roughness) were purchased from Donnelly Corp. Semiconductor 4 was synthesized and purified by the literature procedure, (Garnier, F.; Yassar, A.; Hajlaoui, R.; Horowitz, G.; Deloffre, F.; Servet, B.; Ries, S.; Alnot, P. J. Am. Chem. Soc. 1993, 115, 8716 (2002), incorporated herein by reference), and new compound 6 was synthesized and characterized by a straightforward methodology. See, Facchetti, A.; Yoon, M.-H.; Marks, T. Mat. Res. Soc. Proc. 2004 and incorporated application Ser. No. 60/609,678.

Semiconductors 5 and 7 were purchased from Aldrich and purified by gradient vacuum sublimation before use. Semiconductor 8 was previously synthesized according to the literature. See, Mushrush, M.; Facchetti, A.; Lefenfeld, M.; Katz, H. E.; Marks, T. J. J. Am. Chem. Soc. 2003, also incorporated herein by reference.

Example 2

Self-assembly procedure. All silicon wafers were cleaned with RCA solution, milli-Q water, and Piranha solution according to standard procedures and were dried as quickly as possible. For alkyl chain self-assembly, clean, dry wafers were placed in a glass holder and immersed in 1-10 mM solutions of $Cl_3Si(CH_2)_8SiCl_3$ in distilled toluene for 1 h at 0° C. under nitrogen. They were then washed with dry toluene twice and then with acetone. For hydrolysis, coated wafers were then immersed in acetone/water (5:1) for 1 h, then rinsed with acetone and methanol and blown dry with a nitrogen stream. Stilbazonium salt and octachlorotrisiloxane capping layers were deposited by procedures described in the literature, (see, Marks, J. Chem. Mater., 2002) and in the aforementioned incorporated patents.

Example 3

Device fabrication. For TFTs, semiconducting materials (4-7) were vacuum deposited at $2-3\times10^6$ Torr (500 Å, 0.2 Å/s) while maintaining the substrate temperature at 60° C. Gold electrodes were then vacuum deposited through shadow masks at $5-6\times10^{-6}$ Torr (500 Å, 0.5 Å/s). For gold electrodes in MIS structures, the same procedure was employed.

Example 4

Electrical measurements. All measurements were carried out in air except for DFHCO-4T TFT device measurements, which were carried out in a customized vacuum probe station ($8\times10^{-5}$ Torr). Coaxial and/or triaxial shielding was incorporated into Signaton probe stations to minimize the noise level. A digital capacitance meter (Model 3000, GLK Instruments) and impedance/gain-phase analyzer (SI 1260, Solartron Analytical) were used for capacitance measurements, and TFT characterization was performed with a Keithly 6430 subfemtoammeter and a Keithly 2400 source meter, operated by a Labview program and GPIB communication.

We claim:

1. An organic thin film transistor device comprising a multi-layer organic dielectric medium and an organic semiconductor thereon, each layer component of said medium coupled one to another with silicon-oxygen bonds, said medium comprising at least one organic dipolar layer comprising a compound comprising a π-polarizable moiety, said medium cross-linked with a siloxane bond sequence.

2. The device of claim 1 wherein said dielectric medium comprises a hydrocarbon layer coupled with silicon-oxygen bonds to said dipolar layer.

3. A device of claim 2 wherein said dielectric medium further comprises at least one siloxane capping layer coupled to said dipolar layer with a silicon-oxygen bonds.

4. The device of claim 3 wherein one of said siloxane capping layers is between said dipolar layer and said hydrocarbon layer and coupled to each of said layers with silicon-oxygen bonds.

5. The device of claim 4 wherein each said silicon-oxygen bond is the condensation product of a hydrolyzable silicon moiety and a hydroxy functionality.

6. The device of claim 5 wherein said silicon moiety is a halogenated silane.

7. The device of claim 1 wherein said dipolar layer comprises a non-linear optical chromophore.

8. The device of claim 7 wherein said chromophore comprises a stilbazolium moiety.

9. The device of claim 2 wherein said hydrocarbon layer comprises a compound comprising an alkyl moiety ranging from about $C_4$ to about $C_{10}$.

10. The device of claim 9 wherein said dielectric medium further comprises a siloxane capping layer between said dipolar layer and said hydrocarbon layer, said capping layer comprising a plurality of siloxane molecular components, each component coupled one to another with silicon to oxygen bonds.

11. The device of claim 1 wherein said organic semiconductor comprises a compound selected from n-type and a p-type semiconductor compounds.

* * * * *

UNITED STATES PATENT AND TRADEMARK OFFICE
CERTIFICATE OF CORRECTION

PATENT NO. : 7,679,079 B1 Page 1 of 1
APPLICATION NO. : 11/181132
DATED : March 16, 2010
INVENTOR(S) : Tobin J. Marks et al.

It is certified that error appears in the above-identified patent and that said Letters Patent is hereby corrected as shown below:

Column 1, Lines 8-12:

"The United States government has certain rights to this invention pursuant to National Science Foundation-MRSEC Grant No. DMR-0076097 and Office of Naval Research Grant No. N00014-02-1-0909, both to Northwestern University." should be --This invention was made with government support under Grant Number DMR-0076097 awarded by the National Institutes of Health (MRSEC) and Grant Number N00014-02-1-0909 awarded by the Office of Naval Research. The government has certain rights in the invention.--

Signed and Sealed this

Seventh Day of September, 2010

David J. Kappos
*Director of the United States Patent and Trademark Office*